US009200359B2

United States Patent
Katsir et al.

(10) Patent No.: US 9,200,359 B2
(45) Date of Patent: Dec. 1, 2015

(54) THIN-LAYERED STRUCTURE

(75) Inventors: Dina Katsir, Lehavim (IL); Daniel Feinman, Moshav Arugot (IL); Yuri Zarnitsky, Ashdod (IL)

(73) Assignee: ACKTAR LTD., Kiryat-Gat (IL)

( * ) Notice: Subject to any disclaimer, the term of this patent is extended or adjusted under 35 U.S.C. 154(b) by 663 days.

(21) Appl. No.: 12/402,790

(22) Filed: Mar. 12, 2009

(65) Prior Publication Data

US 2009/0229998 A1    Sep. 17, 2009

(30) Foreign Application Priority Data

Mar. 12, 2008  (IL) .......................................... 190129
Mar. 8, 2009  (IL) .......................................... 197463

(51) Int. Cl.
| | | |
|---|---|---|
| *B32B 9/00* | (2006.01) | |
| *C23C 14/00* | (2006.01) | |
| *C23C 14/24* | (2006.01) | |
| *C23C 14/56* | (2006.01) | |
| *C23C 30/00* | (2006.01) | |
| *H01J 7/18* | (2006.01) | |
| *C23C 28/00* | (2006.01) | |

(52) U.S. Cl.
CPC ......... *C23C 14/0021* (2013.01); *C23C 14/0036* (2013.01); *C23C 14/24* (2013.01); *C23C 14/56* (2013.01); *C23C 14/562* (2013.01); *C23C 28/322* (2013.01); *C23C 28/345* (2013.01); *C23C 30/00* (2013.01); *H01J 7/183* (2013.01); *Y10T 428/24999* (2015.04); *Y10T 428/249953* (2015.04)

(58) Field of Classification Search
USPC ................. 428/304.4, 318.4, 319.1
See application file for complete search history.

(56) References Cited

U.S. PATENT DOCUMENTS

| | | | | |
|---|---|---|---|---|
| 3,851,173 | A |    | 11/1974 | Taylor et al. |
| 5,091,233 | A | * | 2/1992 | Kirby et al. ..................... 428/69 |
| 5,177,364 | A |    | 1/1993 | Gowlett |
| 5,365,742 | A | * | 11/1994 | Boffito et al. ................. 62/46.2 |
| 5,505,810 | A | * | 4/1996 | Kirby et al. .................... 156/286 |

(Continued)

FOREIGN PATENT DOCUMENTS

| | | |
|---|---|---|
| EP | 0464893 | 1/1992 |
| EP | 0837502 | 4/1998 |

(Continued)

OTHER PUBLICATIONS

SAES Getters Inc., St 170-St 172 Brochure; www.saesgetter.com.

(Continued)

*Primary Examiner* — Mark Ruthkosky
*Assistant Examiner* — Daniel J Schleis
(74) *Attorney, Agent, or Firm* — Pearl Cohen Zedek Latzer Baratz LLP

(57) ABSTRACT

The invention provides a vacuum enclosure which is defined by a wall having inner and outer surfaces, where the inner surface is in contact with the vacuum and the outer surface is in contact with ambient air. The vacuum enclosure is characterized by the presence therein of a getter for undesired gaseous contaminants. The getter includes a substrate (either integral with the inner surface or not) and, deposited thereon by vacuum deposition, a thin-layer laminate including at least one layer ($\alpha$) of substance(s) such as platinum group metals and oxides thereof, and at least one porous hydrophilic layer ($\beta$). A corresponding layered structure having utility as a getter is also part of the invention.

21 Claims, 6 Drawing Sheets

(a)   (b)

(c)   (d)

(56) References Cited

U.S. PATENT DOCUMENTS

| | | | |
|---|---|---|---|
| 5,888,925 A | | 3/1999 | Smith et al. |
| 6,110,808 A | * | 8/2000 | Saito ............................ 438/471 |
| 6,200,494 B1 | * | 3/2001 | Manini et al. .............. 252/181.7 |
| 6,673,400 B1 | * | 1/2004 | Bedinger et al. ............. 428/34.1 |
| 6,958,260 B2 | * | 10/2005 | Bedinger et al. ............. 438/115 |
| 2004/0253476 A1 | | 12/2004 | Conte et al. |
| 2006/0278965 A1 | * | 12/2006 | Foust et al. .................. 257/678 |

FOREIGN PATENT DOCUMENTS

| | | |
|---|---|---|
| GB | 1339524 | 12/1973 |
| JP | 04-313317 | 5/1992 |
| JP | 10-219480 | 8/1998 |
| WO | WO 03/053577 | 7/2003 |

OTHER PUBLICATIONS

European Search Report for EP 09100179 dated Jun. 30, 2009.
Ramesham, Rajeshuni, Ph.D.; Getters for Reliable Hermetic Packages, Jet Propulsion Laboratory, 1999 JPL Publication D-17920/NASA, pp. 14-17.
European Search Report of European Application No. EP 09100179 dated Jun. 22, 2009.
Japanese Notice of Allowance of Japanese Application No. 2009-059664 dated Jun. 2, 2015.

* cited by examiner (a)              (b)

Fractal Black™

Ultra Black™

THIN-LAYERED STRUCTURE

FIELD AND BACKGROUND OF THE INVENTION

The present invention relates to a thin-layer laminate having utility as a getter for undesired gaseous contaminants in a vacuum enclosure, and to a vacuum enclosure characterized by the presence of this getter.

Without prejudice to the broad concept and scope of the invention, the background will be described with particular reference to high vacuum devices in the form of Infra-red (IR) radiation detectors. These commonly comprise a dewar envelope having an inner wall and an outer wall, a vacuum space being present between the inner and outer walls; the inner wall defines an inner chamber of the dewar; an infra-red radiation detector element is mounted in the vacuum space and on the end face of said inner wall; a cooling element is provided in the inner chamber and serves to cool the inner wall and the detector element mounted thereon during operation of the detector. The cooled inner wall is often termed "the cold finger" of the detector.

It is known that a prime cause of detector failure is the gradual degradation of the vacuum in the space between the inner and outer walls due to diffusion and internal out-gassing of the various parts of the detector. The excessive out-gassing which occurs in infrared detectors is associated with the fact that the gases cannot be driven out by baking the whole device during pumping (in the way which is usual for other vacuum devices) because infrared detector elements are damaged at high temperatures. Hydrogen is the most destructive gas for semiconductor devices (gallium arsenide and/or indium phosphide), most thermo-conductive gas and besides it is also the most difficult gas component to remove. It has been established that hydrogen is the primary cause of performance degradation in these devices in RF, AC, and DC operating modes.

This degradation in the vacuum eventually leads to the situation in which the cooling element is no longer able (at least in an efficient manner) to cool the detector element sufficiently fast to the desired temperature for efficient detection of infra-red radiation. Thus, the detector lifetime is curtailed, especially as only limited cooling power is available for infrared detectors. Furthermore, the out-gassing into the vacuum space provides a thermal path between the cold finger and the outside of the detector possibly leading to the formation of dew on the infrared window of the detector in a normal atmosphere.

In order to reduce the effects caused by this internal out-gassing at least one getter is normally provided in the vacuum space for removal of undesired gas molecules from this space.

Usually an infrared detector incorporates a non-evaporable chemically-active SAES getter (e.g. SAES Getters Inc., St 171-St 172 Brochure;) which is mounted on the outer wall and in the vacuum space between the outer wall and the cold finger. Such chemical getters are typically activated by heating to a high temperature after evacuation and sealing of the dewar envelope. This is normally achieved with an electrical heating element embedded in the getter material formed as a unit with electrical connection leads passing through vacuum-tight seals in the dewar wall (C. Taylor, S. Whicker, "Thermal Energy Receiver", U.S. Pat. No. 3,851,173). Such getters, when mounted on the outer envelope, require minimal spacing from the detector elements which could otherwise be damaged by the very high activation temperature. In some cases extra heat shields are used to protect the internal components from being damaged during this getter activation process. Though this type of architecture is effective in removing the residual gas molecules from the volume, it often leads to an increased size for the dewar envelope and even adoption of unconventional dewar envelopes. In addition the high temperatures reached during getter activation are also the source for additional internal out-gassing as a result of the unavoidable heating of the internal components.

These limitations of current designs are constantly driving developments seeking alternative solutions in getter applications, that would allow for a more simplified construction and a reduced activation temperature inside the detector enclosure.

The getter is typically a reactive solid material that either adsorbs, absorbs, chemisorbs, or catalyzes a reaction that immobilizes or destroys one or more targeted contaminant compounds, in particular contaminant gases. For example, hydrogen can be released from various sources within an enclosure containing electronic assemblies and subassemblies. Hydrogen does not readily escape from environmentally sealed enclosures and reacts with hydrogen sensitive components. Furthermore, the unique thermal properties of hydrogen can be the cause of increased thermal loss. Several metals and nonmetals, used in production of IR detector components, can contain dissolved hydrogen that is released over time. The package materials can also sometimes release hydrogen. Plated nickel layers used as a barrier layer for gold plating operations and plastic resins are known to release hydrogen in amounts that can degrade the vacuum level and performance of semi-conductor and electrical components (R. Ramesham, "Getters for Reliable Hermetic Packages", JPL Publication D-1792/NASA, pp 14-17, 1999).

As regards other undesired contaminants, e.g., glass (quartz elements of the device) often contains inside a certain quantity of water, and this component is gradually released as water vapor in the device volume. Organic compounds are often responsible for the presence of water vapor, carbon monoxide CO, and carbon dioxide $CO_2$ within the sealed device. Additional gas mixtures may be generated during device manufacturing procedures such as the out-gassing process, welding, and high-rate heating of the pumping tube, when it is disconnected from vacuum pump system.

U.S. Pat. No. 5,365,742 (Boffito, et al.) describes a device for the removal of hydrogen from a vacuum enclosure at cryogenic temperatures, which comprises a metal support (e.g. an Al strip) a composition able to absorb hydrogen, adherent to at least one surface of the support. The composition comprises a porous absorber of water vapor, preferably powdered alumina in contact with palladium oxide PdO which preferably covers, at least partially, the water absorber. In practice $Pd(OH)_2$ mixed with alumina may be precipitated on and attached to the support, then reduced to Pd metal, and re-oxidized to PdO.

U.S. Pat. No. 5,888,925 (Smith et al.) discloses a hydrogen absorbing material, and a method for its manufacture wherein platinum group metal oxide(s), a desiccant (such as a molecular sieve) and a matrix-forming binder (such as an RTV silicone) are mixed together; and the mixture is cured in an oxygen-containing gas (e.g. air) for a time (e.g. at least 24 hours) and a temperature (e.g. 150-204° C.), such that the material is stabilized from self-catalytic degradation.

DEFINITIONS

In the present specification and claims, the following definitions apply. "Active metal" means one or more of magnesium, strontium, calcium, barium, cadmium, iron, titanium, aluminum, hafnium and zirconium. "Platinum group metal"

means one or more of ruthenium, rhodium, palladium, osmium, iridium and platinum. In the thin-layer laminate of the invention, reference to vacuum deposition of substances on a substrate and similar expressions, includes deposition either on one side of a substrate, and, where the context allows (such as in the case of a foil substrate) deposition either on one side on both sides of the substrate.

"Vacuum deposition" and similar expressions includes techniques such as sputtering; (including cathode DC sputtering, RF sputtering, reactive sputtering, etc.), evaporative metal deposition (including reactive evaporative deposition, thermal resistive evaporation, electron beam evaporation, etc.), ion plating, and neutralized ion beam coating.

The aluminum or titanium substrates (e.g. foil substrates) mentioned herein include alloys of aluminum and/or titanium known in the art.

OBJECTS OF THE INVENTION

It is an object of the invention to provide a gettering solution that allows for a more compact design of hermetically sealed vacuum devices than in conventional getter configurations.

It is a further object of the invention to provide a thin-layer laminate having utility as a getter for undesired gaseous contaminants in a vacuum enclosure.

Another object of the invention is to provide a getter unit having a large active specific surface area, and yet can be accommodated in the small space of a compact high vacuum device such as a detector envelope, in the latter case without requiring an increased envelope size or an unconventional envelope outline for its accommodation.

Still another object of this invention is to provide a gettering method that does not require adjunct heating devices or very high temperatures for initial activation.

Yet another object is to provide a combined solution which provides high absorption of stray IR radiation in addition to the function as getter for undesired gases.

Other objects of the invention will be apparent from the description which follows.

SUMMARY OF THE INVENTION

The present invention provides, in one aspect, a vacuum enclosure which is defined by a wall having inner and outer surfaces, where the inner surface is in contact with the vacuum and the outer surface is in contact with ambient air, and which is characterized by presence therein of a getter for undesired gaseous contaminants, wherein the getter comprises a substrate having deposited thereon a thin-layer vacuum deposited laminate including at least one layer of oxide(s) of at least one platinum group metal, and at least one porous hydrophilic layer. In one embodiment the substrate may be a discrete substrate which is not integral with an inner surface of the wall of the vacuum enclosure. In a different embodiment, the substrate is integral with an inner surface of the wall of the vacuum enclosure.

In the vacuum enclosure of the invention, the getter is also preferably characterized by at least one of the following features: (a) the at least one layer of oxide(s) of at least one platinum group metal is deposited on the substrate, and the at least one porous hydrophilic layer is deposited on the at least one layer of oxide(s) of at least one platinum group metal; (b) the at least one platinum group metal comprises or consists of palladium; (c) the vacuum deposited oxide(s) is(are) formed by reactive vacuum deposition of at least one platinum group metal in presence of oxygen; (d) the at least one porous hydrophilic layer comprises a mixture of at least one active metal with at least one active metal oxide; (e) the substrate is selected from metal, metal alloy, glass and ceramic substrates. (f) the at least one porous hydrophilic layer is optically black and/or absorbs IR radiation within the 1-14 micron wavelength range.

More preferably, the getter is characterized also by at least one of the following features: (i) the vacuum deposited mixture has a fractal surface configuration; (ii) the vacuum deposited mixture is formed by reactive vacuum deposition of at least one active metal in presence of oxygen under predetermined conditions adapted for the formation of the mixture, e.g., in an inert atmosphere at a pressure of between $10^{-3}$ torr and $10^{-2}$ torr, into which oxygen has been introduced at a pressure of from one to two orders of magnitude less than the inert atmosphere pressure.

In particular embodiments, the substrate may be in the form of a roll; and/or the substrate may be aluminum or titanium e.g. as foil, and/or the at least one active metal is selected from aluminum and titanium, and/or the vacuum enclosure forms part of an IR detection system.

In a modification of the vacuum enclosure and layered structure of the invention defined above, the "at least one layer of oxide(s) of at least one platinum group metal" is replaced by "at least one layer of substance(s) selected from the group consisting of platinum group metals and oxides thereof". In other words, in place of the platinum group metal oxide(s) as described above, there may be substituted platinum group metal(s) or a mixture of such metal(s) and oxide(s). It will be appreciated that while the "at least one layer . . . " just mentioned, when including oxide(s) may be formed by reactive vacuum deposition of at least one platinum group metal in presence of oxygen, when not including oxide(s) it may be formed by non-reactive vacuum deposition of at least one platinum group metal.

In a further modification of the vacuum enclosure and layered structure of the invention described in the preceding paragraph, the "at least one layer of substance(s) selected from the group consisting of platinum group metals and oxides thereof" is a platinum group metal layer or layers, and the substrate is constituted by a layer of hydrogen-absorbing transition metal(s) selected e.g. from Ti, Zr, Ta, V, Nb and Hf or any of their alloys, the transition metal layer being optionally deposited onto a further substrate.

A presently preferred structure comprises titanium substrate, e.g. a titanium foil substrate, on which is deposited a Pd and/or PdO layer, on top of which is deposited a black hydrophilic layer.

In another aspect, the invention provides a layered structure which comprises a thin-layer laminate vacuum deposited on a substrate, which has utility as a getter for undesired gaseous contaminants, wherein the laminate includes at least one layer of oxide(s) of at least one platinum group metal, and at least one porous hydrophilic layer provided that the structure includes one, two or three of the following features (A), (B) and (C), namely:

(A) the at least one layer of oxide(s) of at least one platinum group metal is deposited on the substrate, and the at least one layer of the porous hydrophilic layer is deposited on the at least one layer of oxide(s) of at least one platinum group metal;

(B) the porous hydrophilic layer comprises a mixture of at least one active metal with at least one active metal oxide;

(C) the porous hydrophilic layer is optically black and/or absorbs IR radiation within the 1-14 micron wavelength range.

The layered structure of the invention may also be additionally characterized by any one or more of the corresponding embodiments for the getter, as set forth above.

BRIEF DESCRIPTION OF THE DRAWINGS

Embodiments of the present invention, or parts or properties thereof are illustrated as follows.

DETAILED DESCRIPTION OF THE INVENTION

The present thin film getter comprises two vacuum deposited layers: a base layer of PdO and/or pure Pd and an upper, inorganic, highly porous hydrophilic layer composed of metal and metal-oxide admixtures. The outer layer can simultaneously serve as a wideband (1-14 micron) IR/light absorbing layer which exhibits a deep black color or its optical characteristics can be tailored to the application. This stacked layer structure deposited directly on the inner walls of the device, is intended to combine together both the optical absorbance and gettering capacity required inside the IR detector envelope, and eliminates the need for use of additional independent getter devices within this volume. The unique property of metallic palladium to absorb extremely large quantities of hydrogen at low temperatures is applied herein to produce an efficient getter structure. The getter under consideration realizes a unique combination of all or some of the following 5 mechanisms:

1. Hydrogen removal by chemical reaction with PdO base layer.

$$PdO + H_2 \rightarrow Pd + H_2O \uparrow; \quad (a)$$

2. Chemical absorption of hydrogen by pure metallic Pd formed in above reaction (a).
3. Physical absorption of water vapor (a) and other gases by the upper inorganic highly porous hydrophilic layer. This process consists of physical adsorption of water by the highly developed internal surface of this layer, and parallel chemical processes of metal oxide hydration.
4. Other gaseous contaminants of lesser importance than hydrogen—such as carbon oxides ($CO_2$; CO) and hydrocarbons—may be present in the evacuated space. These gases are also efficiently absorbed. Nitrogen, oxygen, and CO are absorbed by the pure metallic islands present in the pores of the upper hydrophilic layer and capture of some gases, such as carbon dioxide is promoted by presence of the water molecules inside the pores.
5. Hydrogen absorption by a pure metallic Pd layer and subsequent diffusion of the hydrogen into a sub layer of transition metal, e.g. titanium, from which the natural surface oxide has been removed. Hydrogen is stored within the bulk titanium effectively and irreversibly at operational temperatures of the device.

The above mentioned oxide reduction reaction (a) is exothermic and is also essentially irreversible; it proceeds easily within a wide range of temperatures from −55° C. up to 200° C. Palladium oxide is preferably used as the basis of getter structure because of cost considerations. However, other metals oxides, particularly those of the platinum group metals, such as Rh, Ru, Pd, Os and Ir, and alloys of platinum group metals, can be considered also.

The amounts of materials required for achieving the required performance and therefore the thickness of the deposited layers, depends greatly on the application and the total area of coated surfaces inside the hermetically sealed volume. For a standard IR detector enclosure the optimal thickness of platinum metal oxide layer e.g. PdO was found to be in the range of 0.1-10, e.g. 3-10 microns. Optimal thickness of the highly porous hydrophilic layer is 5-50, e.g. ~25 microns. The gettering capabilities (capacities) in this case were found to be comparable to St 172 getters commonly used in similar applications.

Figure 1:
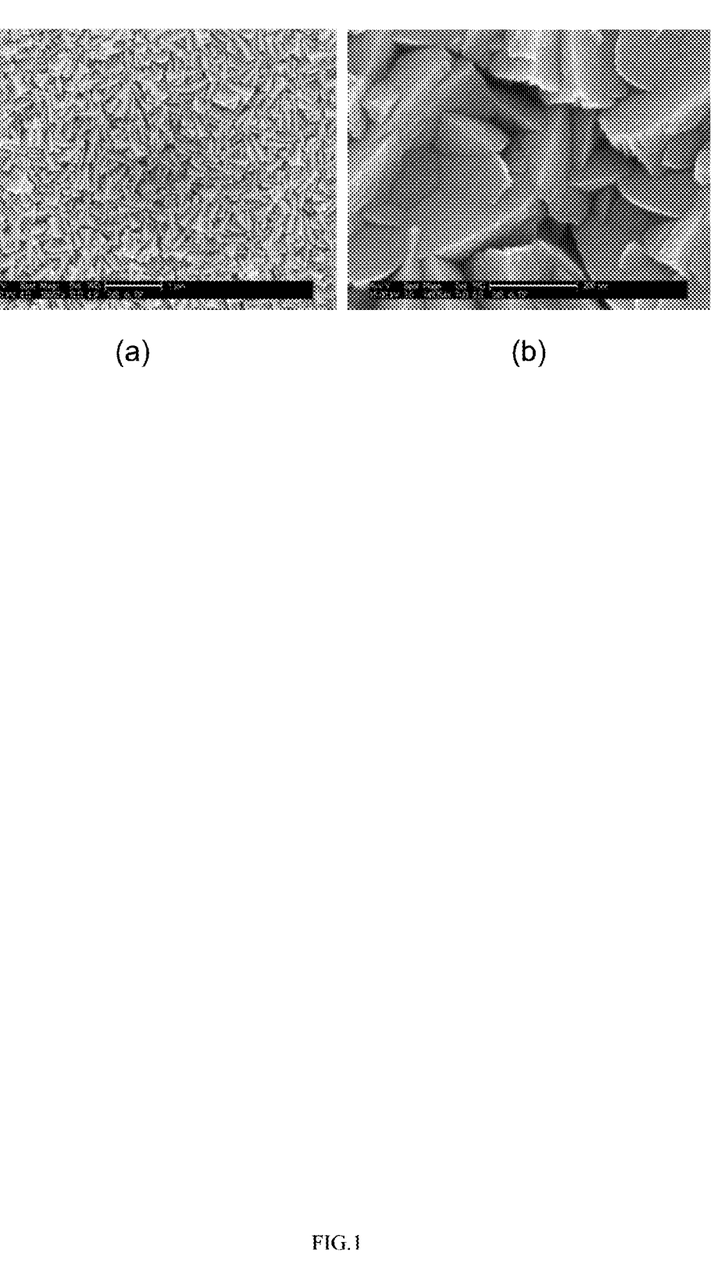
FIG. 1 shows SEM images of the porous PdO layer.
Figure 2:
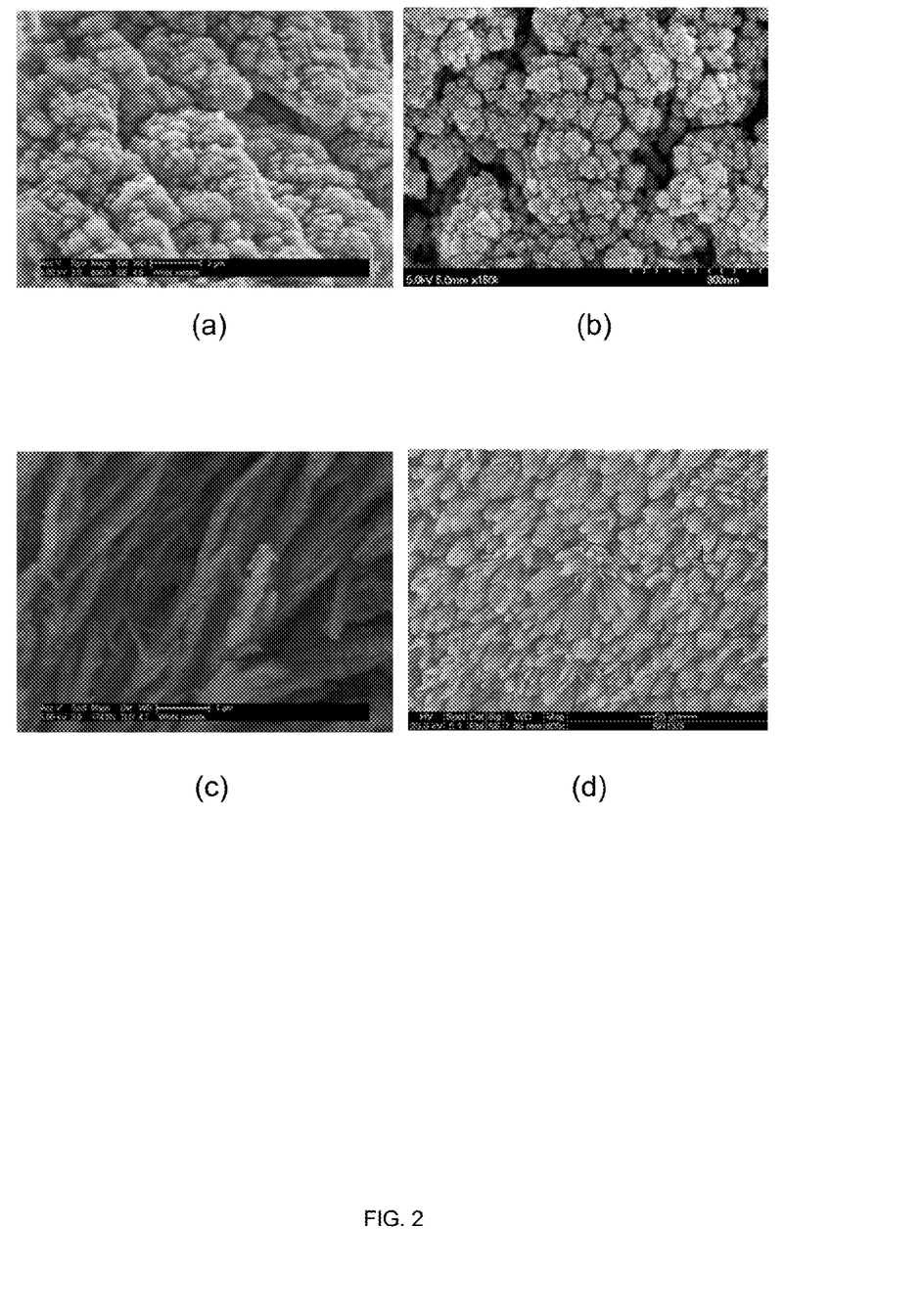
FIG. 2 shows SEM images of various porous inorganic IR absorbing layers.

FIGS. 1a-b show SEM images of the PdO layer produced through the reactive sputter deposition of pure Pd onto the substrate. The enhanced porosity leads to an increased pores volume and promotes faster reaction with the hydrogen to produce $H_2O$ molecules.

FIGS. 2a-d show SEM images of various inorganic metal+ metal oxide admixtures with highly porous structures, obtained by the deposition process as the top layer of the getter. These nano-structured and non-stoichiometric layers are effective in capturing the $H_2O$. These structures were obtained by a vacuum deposition process developed by Acktar Ltd—(a) Ultra Black™ coating, (b) Fractal Black™ coating, (c) Nano-tubes, (d) Nano-flowers.

The PdO layer was analyzed by XPS and also by EDAX as shown in Table 1. It was found, that all the Pd atoms inside the coating are presumably in the +2 oxidation state.

TABLE 1

| PdO layer analysis by EDAX | | | |
|---|---|---|---|
| | Coating | Sample 1 | Sample 2 |
| EDAX ZAF Quantification | Pd at. % | 52.99 | 52.02 |
| | O at. % | 47.01 | 47.98 |
| Element normalized SEC Table: | Total | 100 | 100 |
| | Pd wt % | 88.23 | 87.82 |
| | O wt % | 11.77 | 12.18 |
| Default | Total | 100 | 100 |
| | K ratio: | | |
| 15 kV X-ray energy Tilt 0.00; Take off 46° Det Type: SUTW, res.: 128.6 | Pd | 0.8483 | 0.8433 |
| | O | 0.0255 | 0.0265 |
| | Z values: | | |
| EDAX ZAF Quantification Element normalized SEC Table: Default | Pd | 0.9531 | 0.9516 |
| | O | 1.2658 | 1.2638 |
| | A values: | | |
| | Pd | 1.088 | 1.0091 |
| | O | 0.1714 | 0.1723 |
| | F values: | | |
| | Pd | 1 | 1 |
| | O | 1.0001 | 1.0001 |

The top nano-structured layer of the getter is typically black in appearance and has a dual functionality in the case of IR detection applications. In addition to providing the above mentioned gettering capacity; it also exhibits unique optical characteristics with increased absorbance (as well as high emissivity) in the IR range which is a typical feature required on internal surfaces of the detector cold-shield to eliminate stray light propagation.

Figure 3:
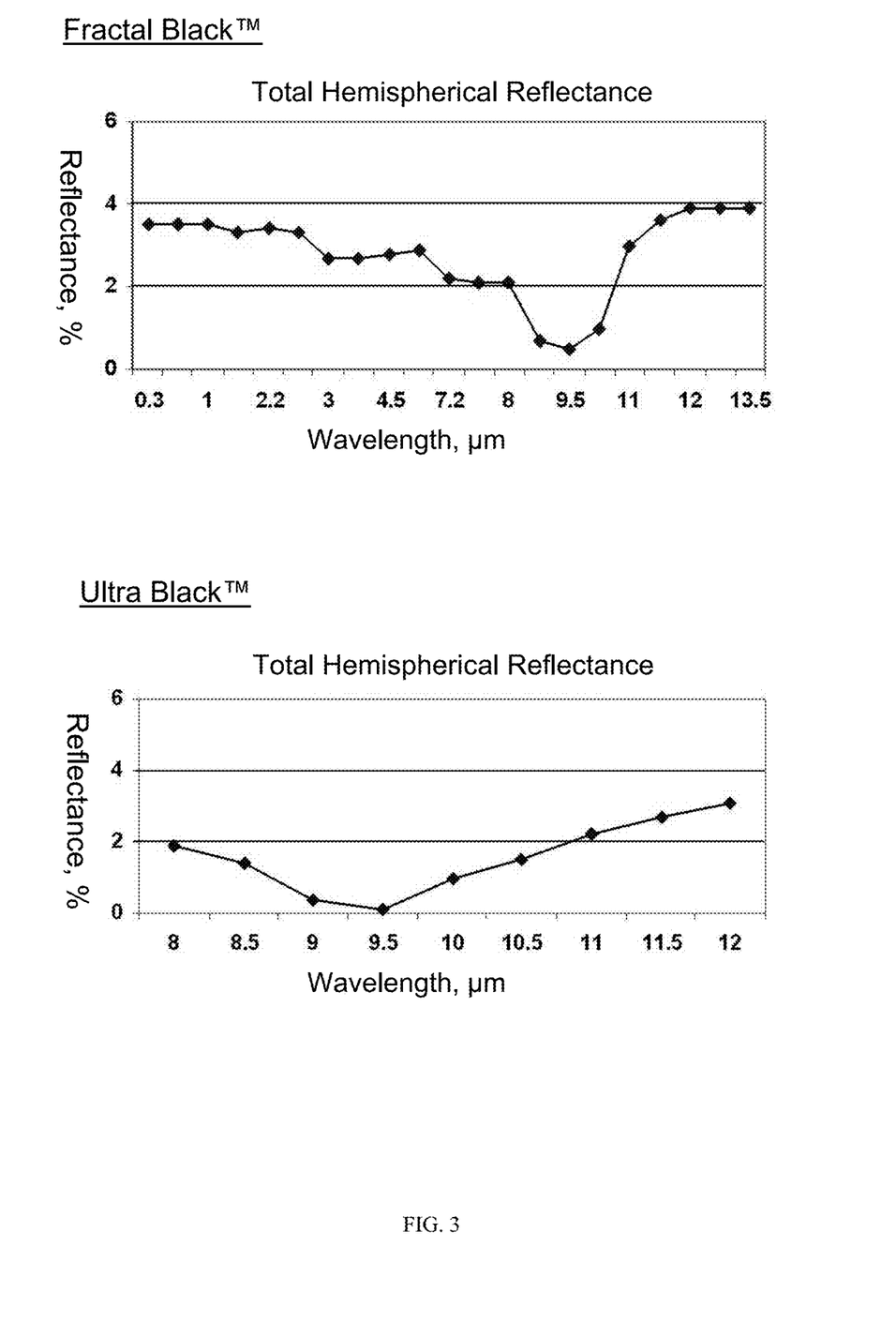
FIG. 3 shows two graphs of hemispherical reflectance of getter top layers.

FIG. 3 shows the hemispherical reflectance of two distinct types of such layers demonstrating the optical properties of the outer getter coating with nearly zero reflectance at 8.5-10 μm wavelengths. Alternatively—for other parts of the detector-dewar structure—the optical characteristics of the outer layer can be tailored appropriately.

The present getters, comprising preferably PdO and an additional water absorbing layer which is optically black and/or absorbs IR radiation within the 1-14 micron wavelength range, are produced exclusively by thin-film vacuum deposition techniques. The PdO layer is first deposited onto the preferred substrate by means of reactive sputtering in a technique which enhances the porosity and active surface area within the layer. Following the PdO deposition, the substrate enters a second process zone (within the same vacuum chamber or as a separate production step), where an additional layer is produced by a reactive evaporation of metal and metal oxide admixtures by a thermal evaporation process. See e.g. U.S. Pat. No. 6,764,712 (Katsir et al.), which describes and claims a method for increasing the surface area of a substrate, comprising the steps of: (a) placing the substrate in an inert atmosphere, having a pressure of between $10^{-3}$ torr and $10^{-2}$ torr, into which oxygen has been introduced at a pressure of from one to two orders of magnitude less than the inert atmosphere pressure; and (b) evaporating active metal(s) only, onto a heated substrate under the oxygen-containing inert atmosphere, whereby the product comprises a mixture of fractal surface structure including at least one active metal and at least one active metal oxide deposited on the substrate.

The second layer provides the $H_2O$ gettering capacity required and in addition it is designed to exhibit unique optical properties required for effective absorption of stray IR light inside the detector enclosure.

Figure 4:
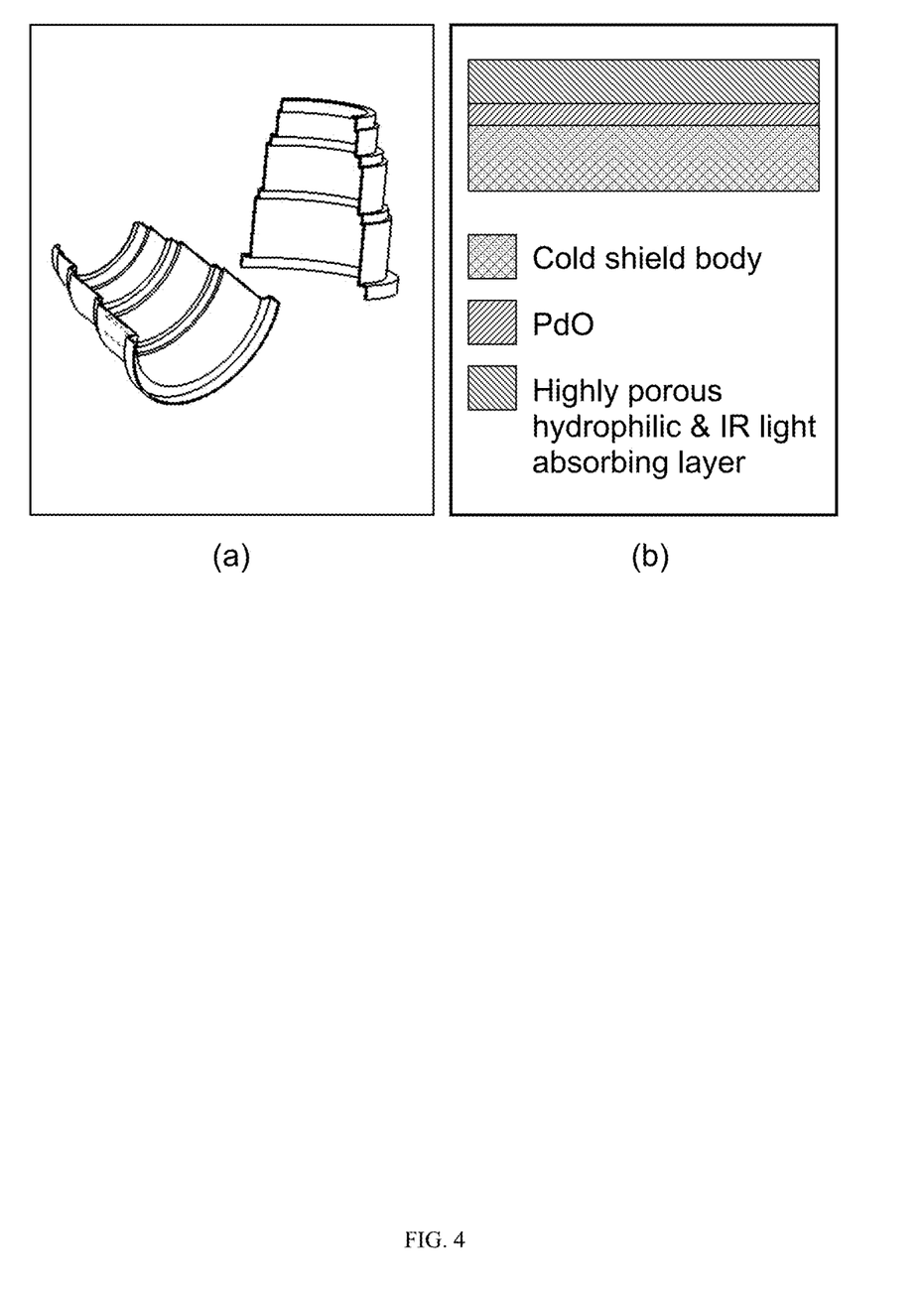
FIG. 4(a) shows a general view of a cold-shield with getter coating.
FIG. 4(b) is a cross-section of a thin-layer laminate.

FIG. 4a shows an image of a typical cold-shield used in an IR detector application where the above mentioned layers are applied onto the inner surface of the shield. FIG. 4b shows a schematic cross section of the stacked layers that comprise the thin film getter on the inside of the shield. The separate PdO and metal/metal oxide layers can also be applied at different ratios and on separate parts or opposite sides within the same vacuum enclosure to satisfy specific applications.

Figure 5:
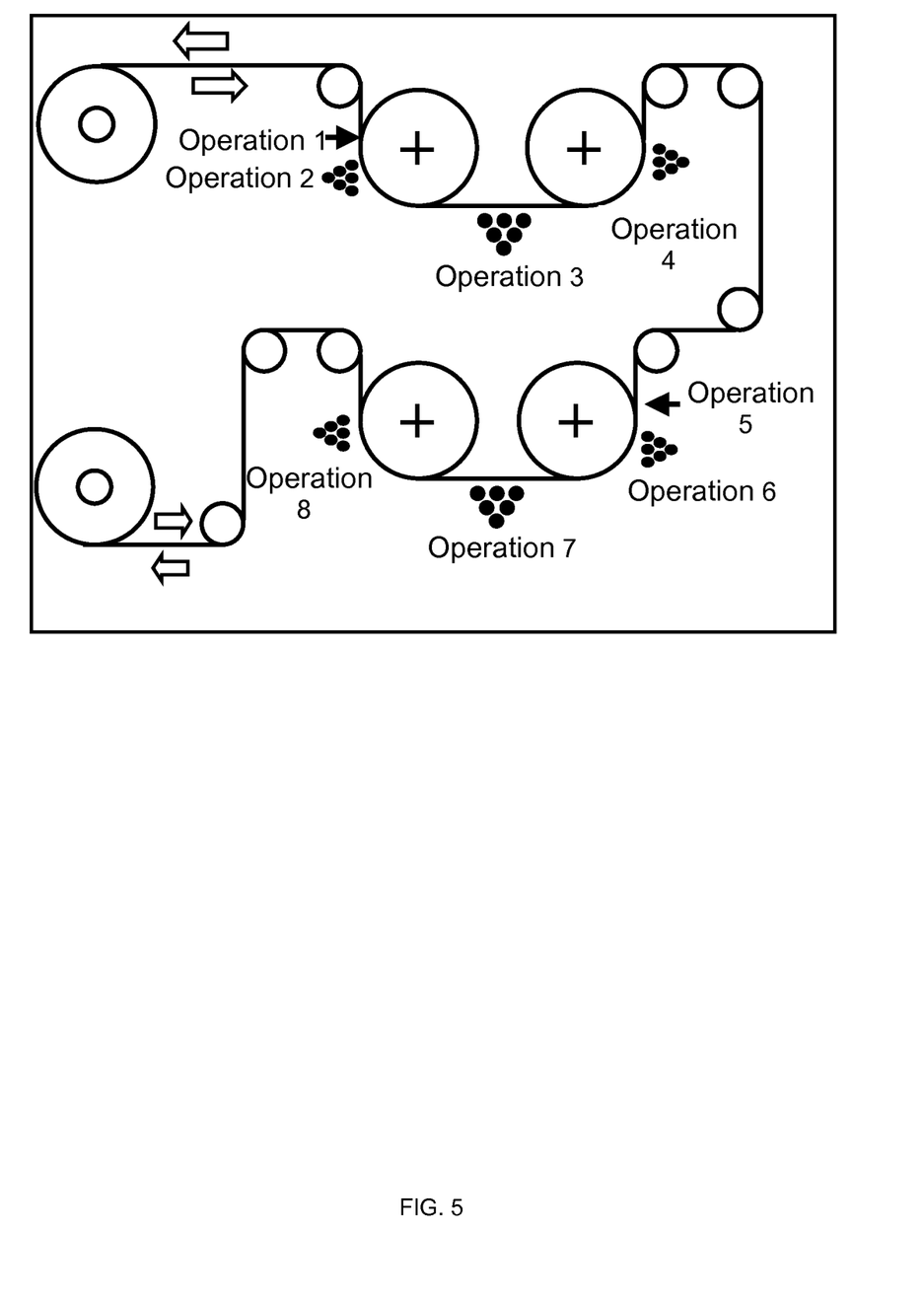
FIG. 5 illustrates an online production process.

Although typical getter applications require the deposition of the specified layers onto structured assembly parts as described above, the concept of this getter is also used to produce products for general applications by depositing the layers onto a thin foil substrate in a roll-to-roll process. Similar process steps are performed in-line inside a unique web coater which is capable of simultaneously performing all process steps onto both sides of the substrate, which is typically Ti or Al foil. The metallic foil substrate is processed in continuous rolls, which allows significant cost reduction through the high volume production process. FIG. 5 illustrates a scheme of an in-line layer deposition process carried out inside a vacuum chamber.

Figure 6:
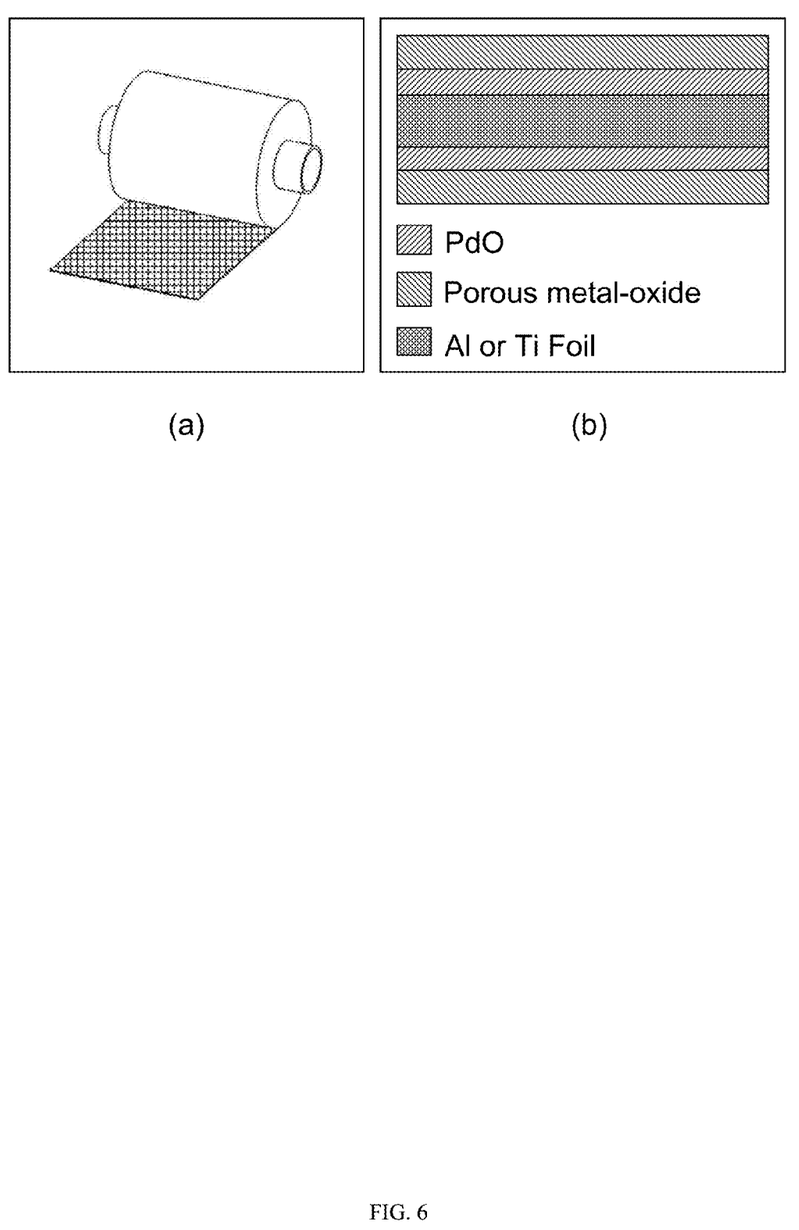
FIG. 6(a) shows a general view of a foil getter in roll form.
FIG. 6(b) shows a cross-section of the foil getter of FIG. 6(a).

FIG. 6a shows the product which is obtained by this process, where the black layer observed on both sides of the substrate is the outer metal/metal oxide layer responsible for the gettering of $H_2O$ molecules and the absorption of stray light and IR radiation. FIG. 6b illustrates the stacked layers as applied onto the continuous roll of substrate material.

The invention will be illustrated by the following Examples.

EXAMPLE 1

A layer of palladium oxide to a desired thickness in the range 3-10 microns was deposited by reactive sputtering of pure palladium in an oxygen rich atmosphere with an Argon background onto either one or both sides of clean aluminum foil substrates held at a temperature of 300° C. and with pressure maintained between 0.3-1 Pa. Aluminum was then evaporated onto the palladium oxide surfaces of the substrates, held at the same temperature, by reactive thermal resistive evaporation, in an anhydrous inert atmosphere in presence of oxygen. The thus-produced $Al/Al_2O_3$ layer has a fractal-like structure with a cauliflower-like morphology. The "cauliflower heads" are about 2 microns across. The "florets" are about 0.2 microns across, so that the surface is self-similar at least
on a distance scale from 0.2 microns to 2 microns. This is confirmed by the visual appearance of the surface. The $Al/Al_2O_3$ surface is black matte (diffusely reflective), showing that this surface has a fractal-like structure on the length scale of the wavelengths of visible light. The following is an EDS elemental analysis of the $Al/Al_2O_3$ surface: N 1.18%, O 30.43%, Al 66.38%, P 1.79% and Ar 0.22%. It follows from stoichiometry that 30.3% of the aluminum was in the form of $Al_2O_3$ and 69.7% was in the form of aluminum metal.

The aluminum foil having deposited on one or both sides, sequential palladium oxide and $Al/Al_2O_3$ layers is suitable for use as a getter (for hydrogen and water vapor, in particular) in high vacuum systems of special applications such as IR detectors. Alternatively, the sequential layers may be deposited directly on the inner surface (e.g. glass) of a potential high vacuum tube.

EXAMPLE 2

A layer of pure palladium to a desired thickness in the range of 100-600 nm was deposited by sputtering of pure palladium in an inert argon atmosphere onto either one or both sides of a titanium sheet, from which the naturally occurring surface oxide was removed and with pressure maintained between 0.1-1 Pa. Aluminum was then evaporated onto the palladium surface(s) of the substrates, by reactive thermal resistive evaporation, in an anhydrous inert atmosphere in presence of oxygen. The thus-produced $Al/Al_2O_3$ layer has a fractal-like structure with a cauliflower-like morphology. The "cauliflower heads" are about 2 microns across. The "florets" are about 0.2 microns across, so that the surface is self-similar at least on a distance scale from 0.2 microns to 2 microns. This is confirmed by the visual appearance of the surface. The $Al/Al_2O_3$ surface is black matte (diffusely reflective), showing that this surface has a fractal-like structure on the length scale of the wavelengths of visible light. The EDS elemental analysis of the $Al/Al_2O_3$ surface is essentially as stated in Example 1.

The titanium sheet having deposited on one or both sides, sequential palladium and $Al/Al_2O_3$ layers is suitable for use as a getter (for hydrogen and water vapour, in particular) in high vacuum systems of special applications such as IR detectors. Alternatively, the sequential layers may be deposited directly on the inner surface (titanium or other transition metal) of a potential vacuum enclosure.

INCORPORATION BY REFERENCE

The entire contents of all of the US Patents mentioned hereinabove are incorporated by reference herein.

ADVANTAGES OF THE INVENTION

The present invention has the advantages of miniaturization (and thus relatively low thermal mass), absence of particulation during entire life time of the detector, high vibration stability, large surface area and thus high sorption capacity at room temperatures, able to be activated at temperatures below 125° C., simplified construction and low cost. The present invention further combines gettering of (at least) hydrogen and water vapor with the potential for absorption of stray light.

Moreover, low temperature activation eliminates the need for electric connections through the dewar wall and reduces dewar design constraints resulting from the need to physically distance the getter surface from the detector elements. Also, the getter layer can be integrated with the internal low reflectance inorganic coating of cold shields and/or coated on internal dewar surfaces with appropriately tailored optical characteristics. Where appropriate, the gettering surface can be generated on a metal foil to be placed in the evacuated area.

It will be evident that in the layered structure/getter of the present invention, the functions of radiation absorber and gas absorber may be combined in the same unit, and that, moreover, in the IR region (1-14 micron wave-length) in particular, emissivity and absorbance may be tailored. Thus e.g. inside a cold shield there may be a laminate with a black hydrophilic layer having high emissivity (above 80%, typically ~95%) and outside there may be a laminate with relatively low emissivity (5-40%, typically ~10%).

Furthermore, the structure of the present invention can be produced continuously, without separate chemical precipitation, reduction and oxidation steps, and without any requirement for use of a binder and a curing agent therefor.

Although the invention has been described with respect to a limited number of embodiments, it is evident that many alternatives, modifications and variations will be apparent to those skilled in the art. Accordingly, the invention is intended to embrace all such alternatives, modifications and variations that fall within the spirit and scope of the appended claims.

The invention claimed is:

1. A vacuum enclosure defined by a wall having inner and outer surfaces, the inner surface in contact with the vacuum and the outer surface in contact with ambient air,
wherein the vacuum enclosure includes therein a getter for at least hydrogen and water vapor, the getter comprising a substrate and deposited thereon, by vacuum deposition, a thin-layer laminate including at least one layer ($\alpha$) of substance(s) selected from the group consisting of platinum group metals and oxides thereof, and at least one porous hydrophilic layer ($\beta$), the porous hydrophilic layer comprising a mixture of at least one active metal with at least one active metal oxide,
wherein the at least one layer ($\alpha$) is deposited on the substrate, and the at least one layer ($\beta$) is deposited on the at least one layer ($\alpha$), wherein the at least one porous hydrophilic layer ($\beta$) is in contact with the vacuum, and
wherein the vacuum-deposited mixture is formed by evaporating at least one active metal in an inert atmosphere at a pressure of between about 0.1 and 1 Pa, into which oxygen has been introduced at a pressure from about one to two orders of magnitude less than the inert atmosphere pressure.

2. The vacuum enclosure of claim 1, wherein the getter further features:
a) wherein when the at least one layer ($\alpha$) is formed including an oxide(s), the oxide(s) is(are) formed by reactive vacuum deposition of at least one platinum group metal in the presence of oxygen, and when formed not including oxide(s), the at least one layer ($\alpha$) is formed by non-reactive vacuum deposition of at least one platinum group metal; and
b) the at least one layer ($\beta$) absorbs IR radiation within a 1-14 micron wavelength range.

3. The vacuum enclosure of claim 1, wherein the getter further includes at least one feature selected from the group consisting of:
(i) the substrate is a foil; and
(ii) the at least one layer ($\alpha$) is a platinum group metal layer or layers, and the substrate is a layer of hydrogen-absorbing transition metal(s) selected from the group consisting of Ti, Zr, Ta, V, Nb, Hf, and alloys thereof.

4. A layered structure comprising
a thin-layer laminate as a getter for at least hydrogen and water vapor, the thin-layer laminate vacuum-deposited on a substrate and including at least one layer ($\alpha$) of substance(s) selected from the group consisting of platinum group metals and oxides thereof, and at least one porous hydrophilic layer ($\beta$), the layer ($\beta$) comprising a mixture of at least one active metal with at least one active metal oxide,
wherein the at least one layer ($\alpha$) is deposited on the substrate, and the at least one layer ($\beta$) is deposited on the at least one layer ($\alpha$), wherein the at least one porous hydrophilic layer ($\beta$) absorbs IR radiation within a 1-14 micron wavelength range, and
wherein the vacuum-deposited mixture is formed by evaporating at least one active metal in an inert atmosphere at a pressure of between about 0.1 and 1 Pa, into which oxygen has been introduced at a pressure from about one to two orders of magnitude less than the inert atmosphere pressure.

5. The layered structure of claim 4, wherein:
a) the at least one layer ($\alpha$) when formed including an oxide(s), the oxide(s) is(are) formed by reactive vacuum deposition of at least one platinum group metal in the presence of oxygen, and when formed to not include oxide(s), the at least one layer ($\alpha$) is formed by non-reactive vacuum deposition of at least one platinum group metal; and
b) the vacuum-deposited mixture is formed to have a fractal surface by reactive vacuum deposition of at least one active metal in the presence of oxygen under predetermined conditions adapted for formation of the mixture.

6. The layered structure of claim 4, further including at least one feature selected from the group consisting of:
(i) the substrate is a foil; and
(ii) the at least one layer ($\alpha$) is a platinum group metal layer or layers, and the substrate is a layer of hydrogen-absorbing transition metal(s) selected from the group consisting of Ti, Zr, Ta, V, Nb, Hf, and alloys thereof.

7. A vacuum enclosure defined by a wall having inner and outer surfaces, the inner surface in contact with the vacuum and the outer surface in contact with ambient air, and
wherein the vacuum enclosure includes therein a getter for at least hydrogen and water vapor, the getter comprising a substrate and deposited thereon, by vacuum deposition, a thin-layer laminate including at least one layer of oxide(s) of at least one platinum group metal, and at least one porous hydrophilic layer comprising a vacuum-deposited mixture of at least one active metal with at least one active metal oxide,
wherein the at least one layer of oxides(s) of at least one platinum group metal is deposited on the substrate, and wherein the at least one porous hydrophilic layer is deposited on the at least one layer of oxide(s) of at least platinum group metal, and wherein the at least one porous hydrophilic layer is in contact with the vacuum.

8. The vacuum enclosure of claim 7, wherein the getter is a thin-layer laminate comprising a substance integral with the inner surface.

9. The vacuum enclosure of claim 7, wherein the vacuum-deposited oxide(s) formed by reactive vacuum deposition of at least one platinum group metal in the presence of oxygen.

10. The vacuum enclosure of claim 7, wherein the substrate is a foil.

11. A layered structure comprising
a thin-layer laminate vacuum-deposited on a substrate, the thin-layer laminate being a getter for at least hydrogen and water vapor,
wherein the thin-layer laminate includes at least one layer ($\alpha$) of substance(s) selected from the group consisting of platinum group metal oxides, and at least one porous hydrophilic layer ($\beta$), wherein the at least one layer ($\alpha$) is deposited on the substrate, and the at least one layer ($\beta$) is deposited on the at least one layer ($\alpha$),
wherein the vacuum-deposited mixture is formed by evaporating at least one active metal in an inert atmosphere at a pressure of between about 0.1 and 1 Pa, into which oxygen has been introduced at a pressure from about one to two orders of magnitude less than the inert atmosphere pressure, and
wherein the at least one porous hydrophilic layer ($\beta$) absorbs IR radiation within a 1-14 micron wavelength range.

12. The layered structure of claim 11, further comprising at least one feature selected from the group consisting of:
a) the platinum group metal oxides are vacuum-deposited oxides formed by reactive vacuum deposition of at least one platinum group metal in the presence of oxygen; and
b) the layer ($\beta$) comprises a mixture of at least one active metal with at least one active metal oxide and the vacuum-deposited mixture is formed to have a fractal surface configuration by reactive vacuum deposition of at least one active metal in the presence of oxygen under predetermined conditions adapted for formation of the mixture.

13. The vacuum enclosure of claim 7, wherein the mixture is vacuum deposited and has a fractal surface configuration.

14. The vacuum enclosure of claim 2, wherein the getter further includes a feature selected from the group consisting of:
(i) a vacuum-deposited mixture of at least one active metal with at least one active metal oxide, the mixture having a fractal surface configuration; and
(ii) a vacuum-deposited mixture formed by reactive vacuum deposition of at least one active metal in the presence of oxygen under predetermined conditions adapted for the formation of the mixture.

15. The vacuum enclosure of claim 3, wherein, when (ii) applies, the transition metal layer is deposited onto a further substrate.

16. The layered structure of claim 6, wherein the transition metal layer is deposited onto a further substrate.

17. The vacuum enclosure of claim 9, wherein the getter further comprises a feature selected from the group consisting of:
(i) a fractal surface configuration on the vacuum-deposited mixture; and
(ii) the vacuum-deposited mixture formed by reactive vacuum deposition of at least one active metal in presence of oxygen under predetermined conditions adapted for formation of the mixture.

18. A vacuum enclosure defined by a wall having inner and outer surfaces, wherein the inner surface is in contact with the vacuum and the outer surface is in contact with ambient air,
the vacuum enclosure includes therein a getter for at least hydrogen and water vapor, the getter comprising a substrate and deposited thereon, by vacuum-deposition, a thin-layer laminate including at least one layer ($\alpha$) of substance(s) selected from the group consisting of platinum group metals and oxides thereof, and at least one porous hydrophilic layer ($\beta$),
wherein said at least one layer ($\alpha$) is deposited on the substrate and said at least one layer ($\beta$) is deposited on the at least one layer ($\alpha$), wherein the at least one porous hydrophilic layer ($\beta$) is in contact with the vacuum, and
wherein the vacuum-deposited mixture is formed by evaporating at least one active metal in an inert atmosphere at a pressure of between about 0.1 and 1 Pa, into which oxygen has been introduced at a pressure from about one to two orders of magnitude less than the inert atmosphere pressure.

19. The vacuum enclosure of claim 18, wherein the substrate is integral with the inner surface.

20. The vacuum enclosure of claim 18, wherein the at least one porous hydrophilic layer ($\beta$) absorbs IR radiation within a 1-14 micron wavelength range.

21. The vacuum enclosure of claim 7, wherein the at least one porous hydrophilic layer absorbs IR radiation within a 1-14 micron wavelength range.

* * * * *